(12) United States Patent
Roy et al.

(10) Patent No.: US 10,192,917 B2
(45) Date of Patent: Jan. 29, 2019

(54) BACKSIDE ILLUMINATED PHOTOSENSOR ELEMENT WITH LIGHT PIPE AND LIGHT MIRROR STRUCTURES

(71) Applicant: STMicroelectronics (Crolles 2) SAS, Crolles (FR)

(72) Inventors: Francois Roy, Seyssins (FR); Bastien Mamdy, Saint Martin d'Heres (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 376 days.

(21) Appl. No.: 15/198,824

(22) Filed: Jun. 30, 2016

(65) Prior Publication Data

US 2018/0006072 A1    Jan. 4, 2018

(51) Int. Cl.
*H01L 27/146* (2006.01)

(52) U.S. Cl.
CPC .... *H01L 27/14629* (2013.01); *H01L 27/1462* (2013.01); *H01L 27/1463* (2013.01); *H01L 27/1464* (2013.01); *H01L 27/14612* (2013.01); *H01L 27/14627* (2013.01); *H01L 27/14609* (2013.01); *H01L 27/14623* (2013.01); *H01L 27/14625* (2013.01)

(58) Field of Classification Search
CPC combination set(s) only.
See application file for complete search history.

(56) References Cited

U.S. PATENT DOCUMENTS

| | | | |
|---|---|---|---|
| 7,524,694 B2 | 4/2009 | Adkisson et al. | |
| 8,093,673 B2* | 1/2012 | Gilton | H01L 27/14603 257/432 |
| 8,436,440 B2 | 5/2013 | Marty et al. | |
| 8,513,761 B2 | 8/2013 | Roy et al. | |
| 8,735,208 B2 | 5/2014 | Roy et al. | |
| 8,847,344 B2 | 9/2014 | Roy et al. | |
| 2009/0200625 A1* | 8/2009 | Venezia | H01L 27/1463 257/432 |
| 2012/0261670 A1 | 10/2012 | Marty et al. | |
| 2012/0261783 A1 | 10/2012 | Prima et al. | |
| 2012/0326256 A1* | 12/2012 | Salsman | H01L 27/14603 257/432 |
| 2013/0193538 A1* | 8/2013 | Jangjian | H01L 31/022433 257/432 |
| 2014/0077323 A1* | 3/2014 | Velichko | H01L 27/14627 257/432 |
| 2014/0197509 A1* | 7/2014 | Haddad | H01L 27/14629 257/432 |

* cited by examiner

*Primary Examiner* — Mamadou Diallo
(74) *Attorney, Agent, or Firm* — Crowe & Dunlevy

(57) ABSTRACT

A photosensor is formed within a semiconductor substrate layer having a front side and a back side. An isolation structure delimits an active region of the semiconductor substrate layer which includes a charge collecting region. The front side of semiconductor substrate layer includes a charge transfer circuit. A reflecting mirror is mounted at the back side of the semiconductor substrate layer. The reflecting mirror includes a pupil opening configured to admit light into the active region at the back side. An underside reflective surface of the reflecting mirror is configured to reflect light received from the active region back into the active region.

20 Claims, 8 Drawing Sheets

BACKSIDE ILLUMINATED PHOTOSENSOR ELEMENT WITH LIGHT PIPE AND LIGHT MIRROR STRUCTURES

TECHNICAL FIELD

The present invention relates to backside illuminated photosensor elements.

BACKGROUND

Reference is made to FIG. 1 showing a cross-section of a conventional backside illuminated photosensor element 10. The illustration in FIG. 1 is of just a single element (also referred to as a pixel), it being understood that an image sensor is formed of a plurality of such photosensor elements typically arranged in an array. The element 10 comprises a semiconductor substrate 12 that is doped with a first conductivity type dopant (for example, a p-type dopant) with a dopant concentration of $1 \times 10^{15}$ to $5 \times 10^{16}$ at/cm$^3$. The semiconductor substrate 12 may, for example, be made of silicon and have a thickness of 3-10 μm. In an embodiment, the semiconductor substrate 12 may comprise the upper silicon layer of a silicon-on-insulator (SOI) substrate that is produced in a process where a handle is attached to the front of the SOI substrate and the back of the SOI substrate is thinned to remove the carrier substrate and buried oxide layers.

At the front surface 14 of the semiconductor substrate 12, a region 16 is provided for trapping photogenerated carriers and charge transfer components. The region 16 is doped with a second conductivity type dopant (for example, an n-type dopant) with a dopant concentration of $1 \times 10^{17}$ to $1 \times 10^{19}$ at/cm$^3$. A circuit 18 for transferring photogenerated charge is also provided at the front surface 14. The circuit 18 comprises a metal oxide semiconductor (MOS) transistor including an insulated gate 20 and a read region 22. The read region 22 is doped with the second conductivity type dopant with a dopant concentration of $1 \times 10^{19}$ to $1 \times 10^{21}$ at/cm$^3$. The insulated gate 20 extends over a channel portion of the substrate 12 between the regions 16 and 22 which form source-drain regions of the MOS transistor. An insulating region 30 including interconnection circuits formed of conductive tracks 32 and vias 34, commonly referred to in the art as metallization levels, is further provided on top of the front surface 14. The conductive tracks 32 of the interconnection circuits may be electrically coupled to the insulated gate 20, read region 22 and substrate 12 body using contact structures (not shown) such as, for example, tungsten plugs.

Each photosensor element includes a pixel substrate (active) region 40 formed by a portion of the substrate 12 that includes the regions 16 and 22. The pixel substrate region 40 is delimited by a surrounding isolation structure 42 that extends from the front surface 14 to the back surface 44 of the semiconductor substrate 12. The isolation structure 42 includes a core region 46 formed of a reflective metal material such as, for example, aluminum, titanium, titanium nitride, titanium alloy, tungsten, chromium, copper, and the like. The isolation structure 42 further includes a peripheral region 48, lining the core region 46 and further a dielectric peripheral region 49 lining the region 48 and positioned between the core region 46 and the pixel substrate region 40. The peripheral region 48 may, for example, be doped with the first conductivity type dopant with a dopant concentration of $1 \times 10^{18}$ to $1 \times 10^{20}$ at/cm$^3$. The peripheral region 49 may comprise, for example, silicon oxide or silicon nitride material.

A layer 50 made of an antireflection dielectric coating (ARC) material is mounted to the back surface 44 of the semiconductor substrate 12. The ARC material may, for example, comprise a resin, an organic polymer, a material including silicon and nitrogen, a material including silicon and oxygen, or a material including silicon, oxygen and nitrogen. A color filter layer 52 is mounted to the antireflection layer 50. The color filter layer 52 may be configured to filter a particular range of electromagnetic wavelengths in the visible and/or infrared range as desired for the particular application of the element 10 and its associated imaging array. A microlens 54 is mounted to the color filter layer 52. The optical axis 56 of the microlens 54 may be aligned with a center 58 of the pixel substrate region 40 as delimited by the surrounding isolation structure 42.

In operation, a ray or photon 59 is collected by the microlens 54 and passes through the color filter layer 52 and antireflection layer 50 to enter the pixel substrate region 40. The ray or photon 59 may generate an electron/hole pair in the semiconductor substrate 12. The electron originating from the received ray or photon 59 is then collected in the region 16. With the application of an appropriate voltage to the insulated gate 20, the MOS transistor of circuit 18 is turned on and the charge collected in region 16 is transferred to read region 22.

Depending on the angle of incidence of the collected ray or photon 59, the ray or photon 59 may pass through the pixel substrate region 40 and be reflected by the core region 46 of the isolation structure 42 and directed towards the front surface 14 of the semiconductor substrate 12 as generally shown at reference 60. This reflected ray or photon 60 may generate an electron/hole pair in the pixel substrate region 40. The electron originating from the reflected ray or photon 60 is then collected in the region 16. With the application of an appropriate voltage to the insulated gate 20, the MOS transistor of circuit 18 is turned on and the charge collected in region 16 is transferred to read region 22. This accordingly produces an increase in sensitivity of the element 10.

It is further known that an electric field produced by the isolation structure 42 functions to force free electrons generated from the ray or photon received in the pixel substrate region 40 towards the center 58 of pixel substrate region 40 where they are more readily captured in the region 16. This further improves the sensitivity of the element 10.

The element 10 further comprises a reflecting metal layer 66 in the insulating region 30. This reflecting metal layer 66 may, for example, be formed by same material as the conductive tracks 32 of the interconnection circuits at a relatively lower one of the plural metallization levels. In an embodiment, reflecting metal layer 66 may be one of the conductive tracks 32 (i.e., it is not a floating conductive element). The reflected ray or photon 60 may pass completely through the semiconductor substrate 12 and insulating region 30 to be further reflected back into the pixel substrate region 40 of the semiconductor substrate 12 by the reflecting metal layer 66 as generally shown at reference 68. The further reflected ray or photon 68 may generate an electron/hole pair in the pixel substrate region 40. The electron originating from the further reflected ray or photon 68 is then collected in the region 16. With the application of an appropriate voltage to the insulated gate 20, the MOS transistor of circuit 18 is turned on and the charge collected in region 16 is transferred to read region 22. This accordingly produces an increase in sensitivity of the element 10.

Notwithstanding the improvements in sensitivity produced by presence of the isolation structure 42 and reflecting metal layer 66, there remains a need for further sensitivity improvement accomplished by increasing opportunities for rays or photons received by the photosensor element to produce electron/hole pairs.

SUMMARY

In an embodiment, a photosensor comprises: a semiconductor substrate layer having a front side and a back side; an isolation structure delimiting an active region of the semiconductor substrate layer; a charge collecting region within the active region; a charge transfer circuit within the active region at the front side of the semiconductor substrate layer; and a reflecting mirror mounted at the back side of the semiconductor substrate layer, said reflecting mirror including a pupil opening configured to admit light into the active region at the back side and including an underside reflective surface configured to reflect light received from the active region back into the active region.

In an embodiment, a photosensor comprises: a semiconductor substrate layer having a front side and a back side; an isolation structure delimiting an active region of the semiconductor substrate layer; a charge collecting region within the active region; a charge transfer circuit within the active region at the front side of the semiconductor substrate layer; an antireflective coating layer mounted to the back side of the semiconductor substrate layer; and a first layer made of a reflective metal material mounted to the antireflective coating layer, said layer including a pupil opening configured to admit light into the active region at the back side, and wherein an underside reflective surface of said layer is configured to reflect light received from the active region back into the active region.

In an embodiment, a semiconductor substrate layer having a front side and a back side; an isolation structure delimiting an active region of the semiconductor substrate layer; a charge collecting region within the active region; a charge transfer circuit within the active region at the front side of the semiconductor substrate layer; an antireflective coating layer mounted to the back side of the semiconductor substrate layer; and a layer made of a reflective metal material mounted to the antireflective coating layer, said layer including a frustoconical aperture filled with a transparent material, said frustoconical aperture defining a reflective conical surface configured to reflect light into the active region at the back side, and wherein an underside reflective surface of said layer is configured to reflect light received from the active region back into the active region.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 1:
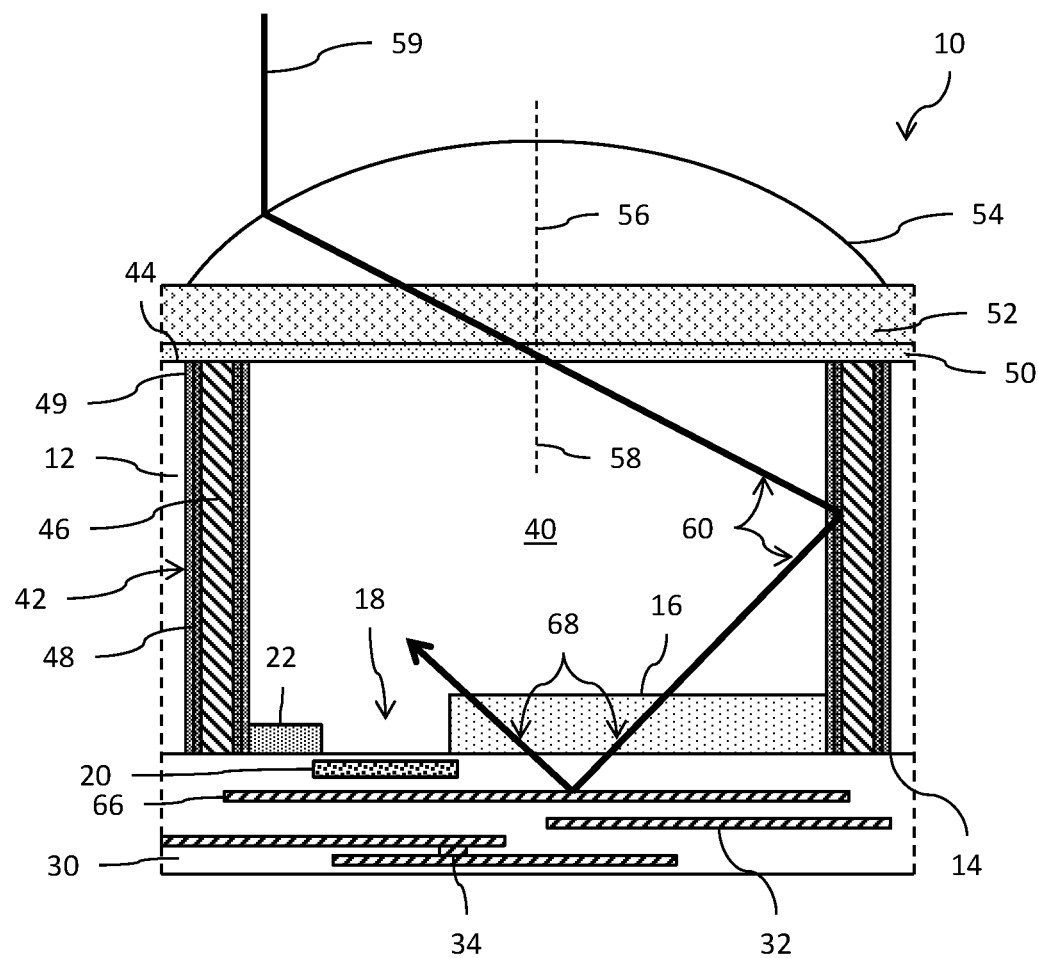
FIG. 1 shows a cross-section of a conventional backside illuminated photosensor element.
Figure 2:
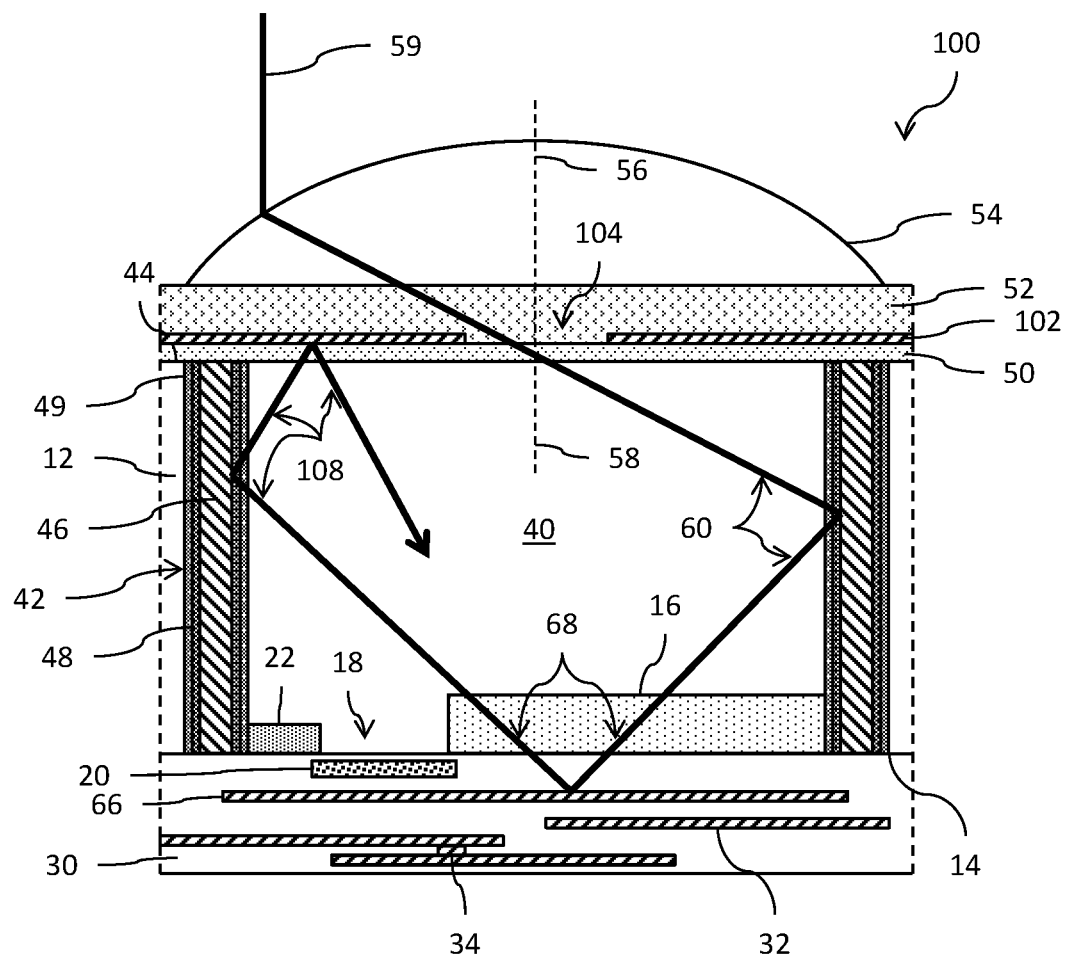
FIG. 2 shows a cross-section of a backside illuminated photosensor element with a backside light mirror.

Reference is now made to FIG. 2 showing a cross-section of a backside illuminated photosensor element 100. Like reference numbers in FIGS. 1 and 2 refer to like or similar components. Description of such components will not be repeated here, and the description presented above with respect to FIG. 1 is incorporated herein by reference. The element 100 differs from the element 10 of FIG. 1 primarily in the further inclusion of a backside light mirror 102. The backside light mirror 102 is mounted to the element 100 between the color filter layer 52 and the antireflection layer 50. The backside light mirror 102 is made of a thin layer of reflective material which may comprise a reflective metal material such as, for example, aluminum, titanium, titanium nitride, titanium alloy, tungsten, chromium, copper, and the like. The backside light mirror 102 is configured as an iris structure with a pupil opening 104 having a fixed aperture size. The center of the pupil opening 104 is preferably aligned with the optical axis 56 of the microlens 54 and may further be aligned with the center 58 of the pixel substrate region 40.

In operation, a ray or photon 59 is collected by the microlens 54 and passes through the color filter layer 52, the pupil opening 104 and antireflection layer 50 to enter the pixel substrate region 40. The ray or photon 59 may generate an electron/hole pair in the pixel substrate region 40 of the semiconductor substrate 12. The electron originating from the received ray or photon 59 is then collected in the region 16. With the application of an appropriate voltage to the insulated gate 20, the MOS transistor of circuit 18 is turned on and the charge collected in region 16 is transferred to read region 22.

Depending on the angle of incidence of the collected ray or photon 59, the ray or photon 59 may pass through the pixel substrate region 40 and be reflected by the core region 46 of the isolation structure 42 and directed towards the front surface 14 of the semiconductor substrate 12 as generally shown at reference 60. The reflected ray or photon 60 may generate an electron/hole pair in the pixel substrate region 40 of the semiconductor substrate 12. The electron originating from the reflected ray or photon 60 is then collected in the region 16. The reflected ray or photon 60 may pass completely through the semiconductor substrate 12 and insulating region 30 to be further reflected back into the pixel substrate region 40 of the semiconductor substrate 12 by the reflecting metal layer 66 as generally shown at reference 68. The further ray or photon 68 may generate an electron/hole pair in the pixel substrate region 40 of the semiconductor substrate 12. The electron originating from the further reflected ray or photon 66 is then collected in the region 16. The further reflected ray or photon 66 may pass through the pixel substrate region 40 and be additionally reflected by the underside reflective surface of the backside light mirror 102 and directed back towards the front surface 14 of the semiconductor substrate 12 as generally shown at reference 108. The additionally reflected ray or photon 108 may generate an electron/hole pair in the pixel substrate region 40 of the semiconductor substrate 12. The electron originating from the additionally reflected ray or photon 108 is then collected in the region 16. With the application of an appropriate voltage to the insulated gate 20, the MOS transistor of circuit 18 is turned on and the charge collected in region 16 is transferred to read region 22. This accordingly produces an increase in sensitivity of the element 100.

The additionally reflected ray or photon 108 may, depending on incidence and/or reflection angles, further include a reflection off the core region 46 of the isolation structure 42 as shown in FIG. 2.

Figure 3A:
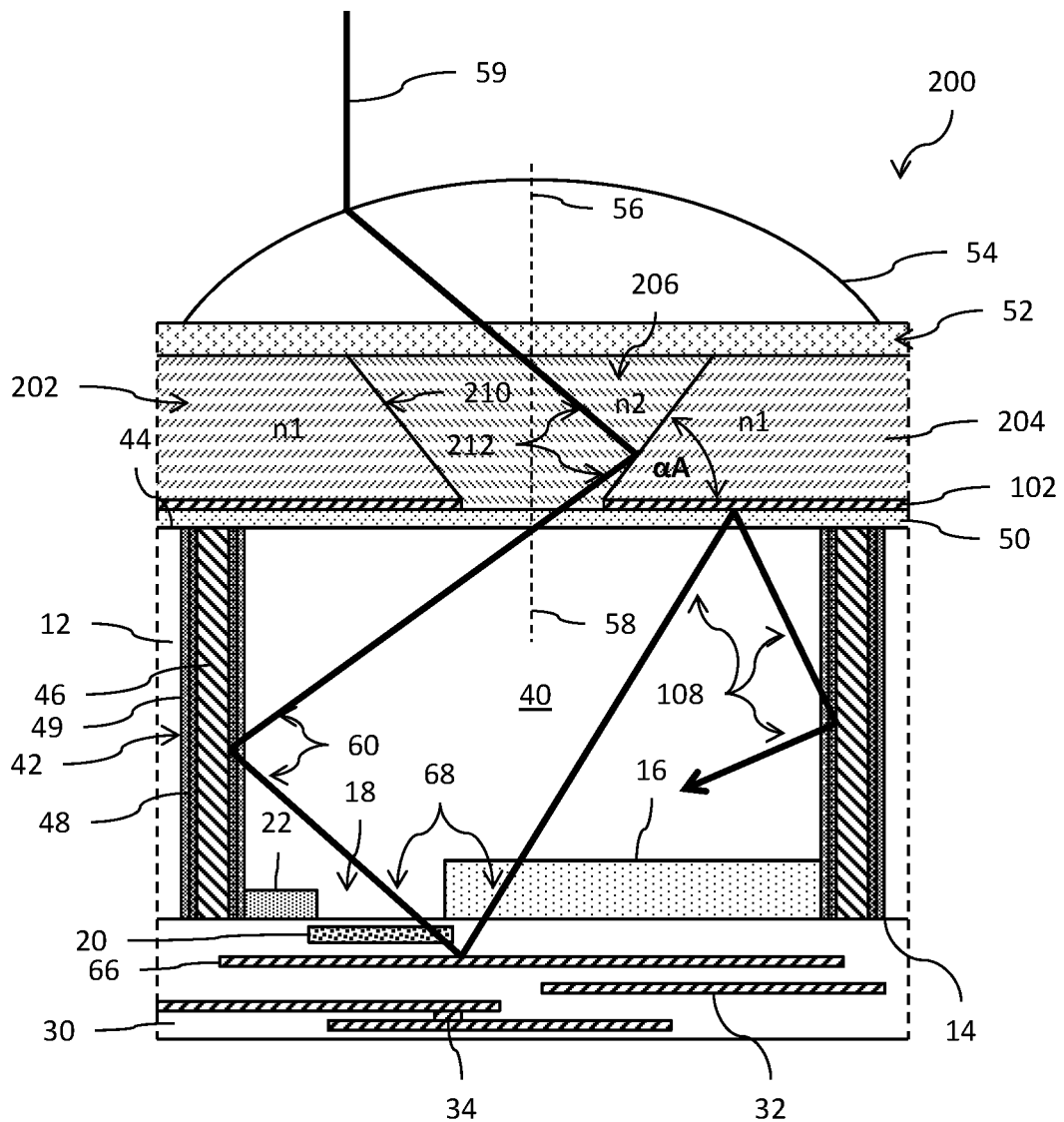
FIGS. 3A-3B show cross-sections of a backside illuminated photosensor element with a backside light guide.
Figure 3B:
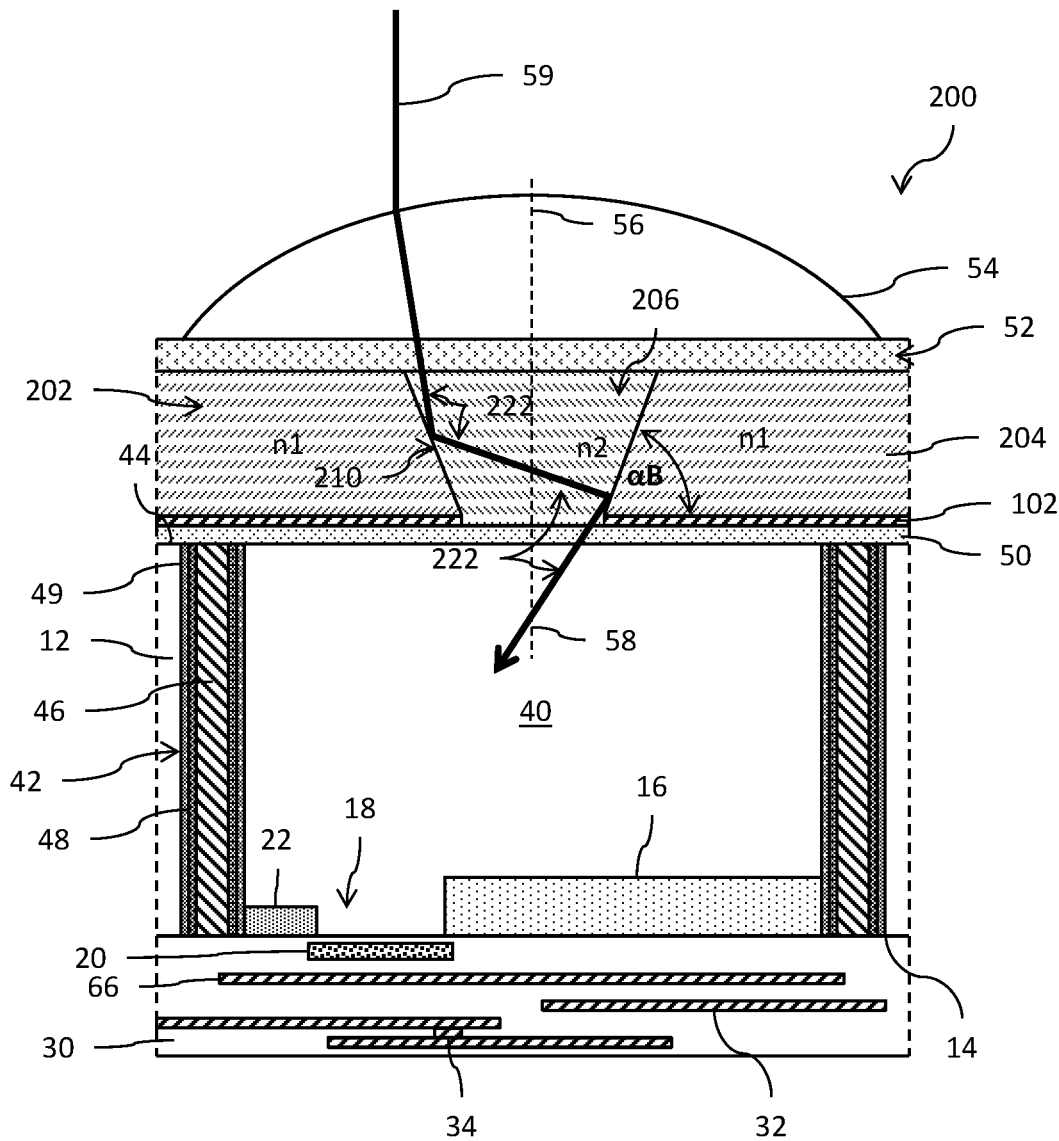

Reference is now made to FIGS. 3A-3B showing cross-sections of a backside illuminated photosensor element 200.

Like reference numbers in FIGS. 1, 2 and 3A-3B refer to like or similar components. Description of such components will not be repeated here, and the descriptions presented above with respect to FIGS. 1 and 2 are incorporated herein by reference. The element 200 differs from the element 100 of FIG. 2 primarily in the further inclusion of a backside light guide 202. In an embodiment, the color filter layer 52 is positioned between the light guide 202 and the microlens 54. In an alternative embodiment (not shown), the light guide 202 is provided in conjunction with the color filter layer 52.

Figure 4:
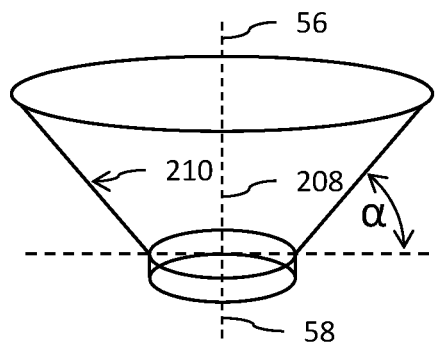
FIG. 4 is a perspective view illustrating a frustoconical shape of a light pipe for a light guide.

The backside light guide 202 includes a body region 204 formed of a first transparent material having a first index of refraction n1. An aperture 206 formed in the body region 204 is filled with a second transparent material having a second index of refraction n2 different from the first index of refraction n1 to form a light pipe extending through the body region 204. The first transparent material may, for example, comprise silicon oxide (SiO) and the second transparent material may, for example, comprise silicon nitride (SiN). The aperture 206 has a frustoconical shape (i.e., the shape of a frustum of a cone) as shown in FIG. 4. The central axis 208 of the frustoconical shaped aperture 206 is preferably aligned with the center of the pupil opening 104 and the optical axis 56 of the microlens 54 and may further be aligned with the center 58 of the pixel substrate region 40.

In operation, a ray or photon 59 is collected by the microlens 54 and passes through the color filter layer 52, the light pipe of the light guide 202, the pupil opening 104 and antireflection layer 50 to enter the pixel substrate region 40. The ray or photon may generate an electron/hole pair in the pixel substrate region 40 of the semiconductor substrate 12. The electron originating from the received ray or photon 59 is then collected in the region 16. With the application of an appropriate voltage to the insulated gate 20, the MOS transistor of circuit 18 is turned on and the charge collected in region 16 is transferred to read region 22.

Depending on the angle of incidence of the collected ray or photon 59, the ray or photon 59 may enter the light pipe of the light guide 202 and be reflected at an interface boundary or surface 210 between the first and second transparent materials having indices of refraction n1 and n2, respectively, as generally shown at reference 212 before passing through the pupil opening 104 and antireflection layer 50 to enter the pixel substrate region 40. This reflection at the interface surface 210 is of the total internal reflection (TIR) type due to the angle of incidence and the difference in the indices of refraction n1 and n2. The reflected ray or photon 212 may generate an electron/hole pair in the pixel substrate region 40 of the semiconductor substrate 12. The electron originating from the reflected ray or photon 212 is then collected in the region 16. This accordingly produces an increase in sensitivity of the element 200.

Again, depending on the angle of incidence of the collected ray or photon 59, the reflected ray or photon 212 may pass through the pixel substrate region 40 and be reflected by the core region 46 of the isolation structure 42 and directed towards the front surface 14 of the semiconductor substrate 12 as generally shown at reference 60. The reflected ray or photon 60 may generate an electron/hole pair in the pixel substrate region 40 of the semiconductor substrate 12. The electron originating from the reflected ray or photon 60 is then collected in the region 16. The reflected ray or photon 60 may pass completely through the semiconductor substrate 12 and insulating region 30 to be further reflected back into the semiconductor substrate 12 by the reflecting metal layer 66 as generally shown at reference 68. The electron originating from the further reflected ray or photon 66 is then collected in the region 16. The further reflected ray or photon 68 may generate an electron/hole pair in the pixel substrate region 40 of the semiconductor substrate 12. The further reflected ray or photon 68 may pass through the pixel substrate region 40 and be additionally reflected by the underside reflective surface of the backside light mirror 102 and directed back towards the front surface 14 of the semiconductor substrate 12 as generally shown at reference 108. The additionally reflected ray or photon 108 may generate an electron/hole pair in the pixel substrate region 40 of the semiconductor substrate 12. The electron originating from the reflected ray or photon 108 is then collected in the region 16. With the application of an appropriate voltage to the insulated gate 20, the MOS transistor of circuit 18 is turned on and the charge collected in region 16 is transferred to read region 22. This accordingly produces an increase in sensitivity of the element 200.

The additionally reflected ray or photon 108 may, depending on incidence and/or reflection angles, further include a reflection off the core region 46 of the isolation structure 42 as shown in FIG. 3A.

Depending on the angle of incidence of the ray or photon 59 collected by the microlens 54 and/or the angle α of the interface boundary or surface 210 between the first and second transparent materials of the light guide 202 relative to a plane parallel to the back surface 44 of the semiconductor substrate 12, the ray or photon 59 collected by the microlens 54 may be totally internally reflected two or more times by the interface boundary or surface 210, as generally shown at references 222 in FIG. 3B before passing through the pupil opening 104 and antireflection layer 50 to enter the pixel substrate region 40. The example illustrated in FIG. 3B shows that the angle αB of the interface boundary or surface 210 is larger than the angle αA of the interface boundary or surface 210 shown in FIG. 3A.

Other possible reflections of the ray or photon 222 are not shown in FIG. 3B, but it will be understood that reflections off one or more of the core region 46 of the isolation structure 42, the reflecting metal layer 66 and the underside reflective surface of the backside light mirror 102, as shown in FIG. 3A, are possible to further improve sensitivity of the element 200.

Reference is now made to FIGS. 5A-5D showing cross-sections of a backside illuminated photosensor element 300. Like reference numbers in FIGS. 1, 2 and 5A-5D refer to like or similar components. Description of such components will not be repeated here, and the descriptions presented above with respect to FIGS. 1, 2 and 3A-3B are incorporated herein by reference. The element 300 differs from the element 100 of FIG. 2 primarily in the further inclusion of a backside light guide 302. In an embodiment, the color filter layer 52 is positioned between the light guide 302 and the microlens 54. In an alternative embodiment (not shown), the light guide 302 is provided in conjunction with the color filter layer 52. Another difference with respect to the element 100 of FIG. 2 is that the backside light guide 302 is further configured as a reflective structure to perform the function of the backside light mirror 102.

The light guide 302 includes a body region 304 formed of a reflective material which may comprise a reflective metal material such as, for example, aluminum, titanium, titanium nitride, titanium alloy, tungsten, chromium, copper, and the like. The backside light guide 302 is configured as an iris structure with a pupil opening 314 having a fixed aperture size. The center of the pupil opening 314 is preferably aligned with the optical axis 56 of the microlens 54 and may further be aligned with the center 58 of the pixel substrate region 40. The pupil opening 314 is formed by an aperture 306 that extends through the body region 304 and is filled with a transparent material having a desired index of refraction to form a light pipe. The transparent material may, for example, comprise silicon oxide (SiO). The aperture 306 has a frustoconical shape (i.e., the shape of a frustum of a cone) as shown in FIG. 4 with the pupil opening 314 provided at the narrowest opening portion at the apex of the frustoconical aperture 306. The center axis of the frustoconical shaped aperture 306 is preferably aligned with the center of the pupil opening 314 and the optical axis 56 of the microlens 54 and may further be aligned with the center 58 of the pixel substrate region 40.

In operation, a ray or photon 59 is collected by the microlens 54 and passes through the color filter layer 52, the light pipe of the light guide 302, the pupil opening 314 and antireflection layer 50 to enter the pixel substrate region 40. The ray or photon 59 may generate an electron/hole pair in the pixel substrate region 40 of the semiconductor substrate 12. The electron originating from the received ray or photon 59 is then collected in the region 16. With the application of an appropriate voltage to the insulated gate 20, the MOS transistor of circuit 18 is turned on and the charge collected in region 16 is transferred to read region 22.

Depending on the angle of incidence of the collected ray or photon 59, the ray or photon 59 may enter the light pipe of the light guide 302 and be reflected at a reflective surface 310 of the frustoconical shaped aperture 306 of the body region 304 as generally shown at reference 312 before passing through the pupil opening 314 and antireflection layer 50 to enter the pixel substrate region 40. The reflected ray or photon 312 may generate an electron/hole pair in the pixel substrate region 40 of the semiconductor substrate 12. The electron originating from the reflected ray or photon 60 is then collected in the region 16. This accordingly produces an increase in sensitivity of the element 200.

Again, depending on the angle of incidence of the collected ray or photon 59, the reflected ray or photon 312 may pass through the pixel substrate region 40 and be reflected by the core region 46 of the isolation structure 42 and directed towards the front surface 14 of the semiconductor substrate 12 as generally shown at reference 60. The reflected ray or photon 60 may generate an electron/hole pair in the pixel substrate region 40 of the semiconductor substrate 12. The electron originating from the reflected ray or photon 60 is then collected in the region 16. The reflected ray or photon 60 may pass completely through the semiconductor substrate 12 and insulating region 30 to be further reflected back into the semiconductor substrate 12 by the reflecting metal layer 66 as generally shown at reference 68. The reflected ray or photon 68 may generate an electron/hole pair in the pixel substrate region 40 of the semiconductor substrate 12. The electron originating from the further reflected ray or photon 68 is then collected in the region 16. The further reflected ray or photon 68 may pass through the pixel substrate region 40 and be additionally reflected by the underside reflective surface of the light guide 302 functioning as a backside light mirror and directed back towards the front surface 14 of the semiconductor substrate 12 as generally shown at reference 108. The additionally reflected ray or photon 108 may generate an electron/hole pair in the semiconductor substrate 12. The electron originating from the reflected ray or photon 108 is then collected in the region 16. With the application of an appropriate voltage to the insulated gate 20, the MOS transistor of circuit 18 is turned on and the charge collected in region 16 is transferred to read region 22. This accordingly produces an increase in sensitivity of the element 200.

Figure 5A:
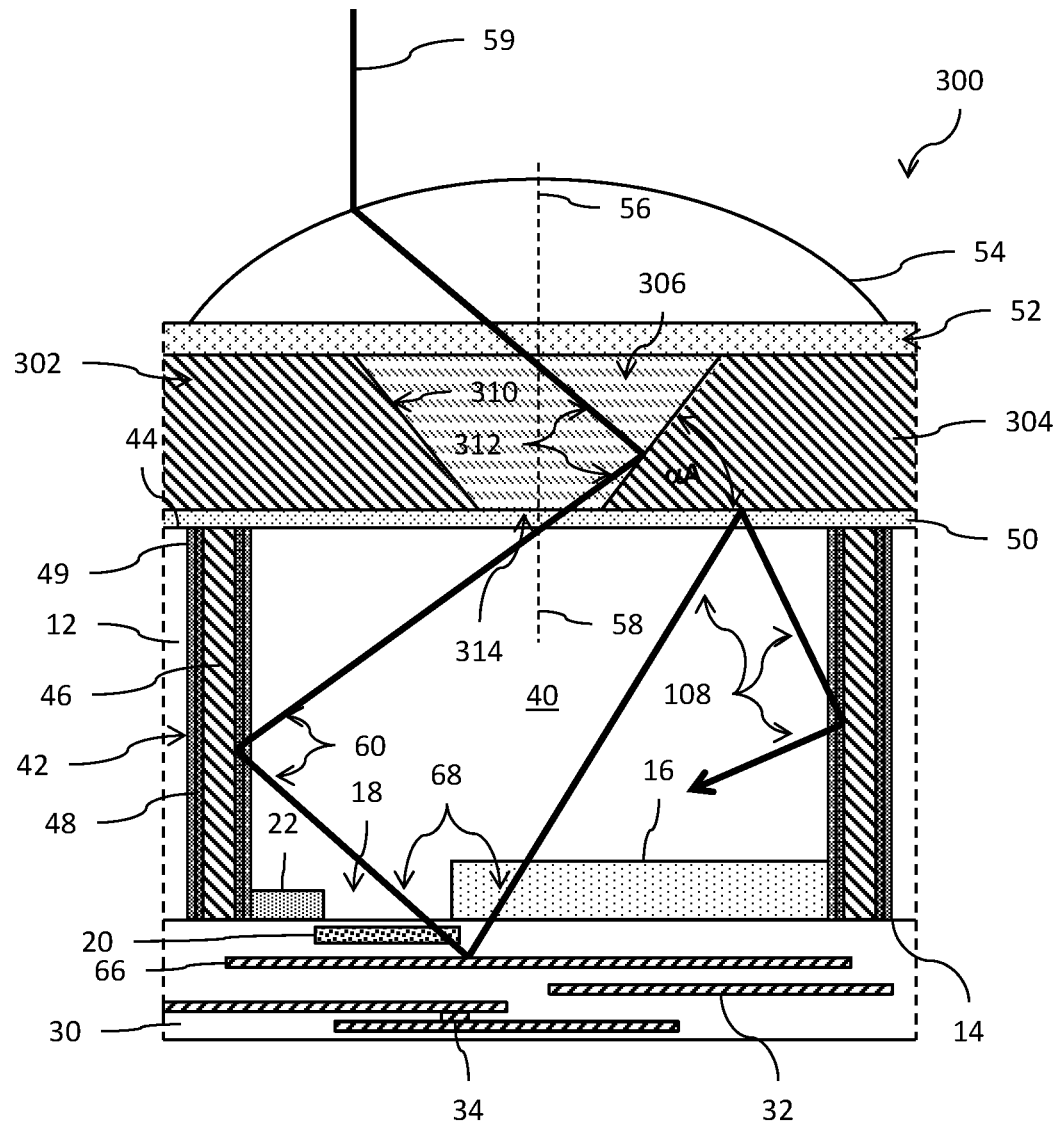
FIGS. 5A-5D show cross-sections of a backside illuminated photosensor element with a backside light guide.

The additionally reflected ray or photon 108 may, depending on incidence and/or reflection angles, further include a reflection off the core region 46 of the isolation structure 42 as shown in FIG. 5A.

Figure 5B:
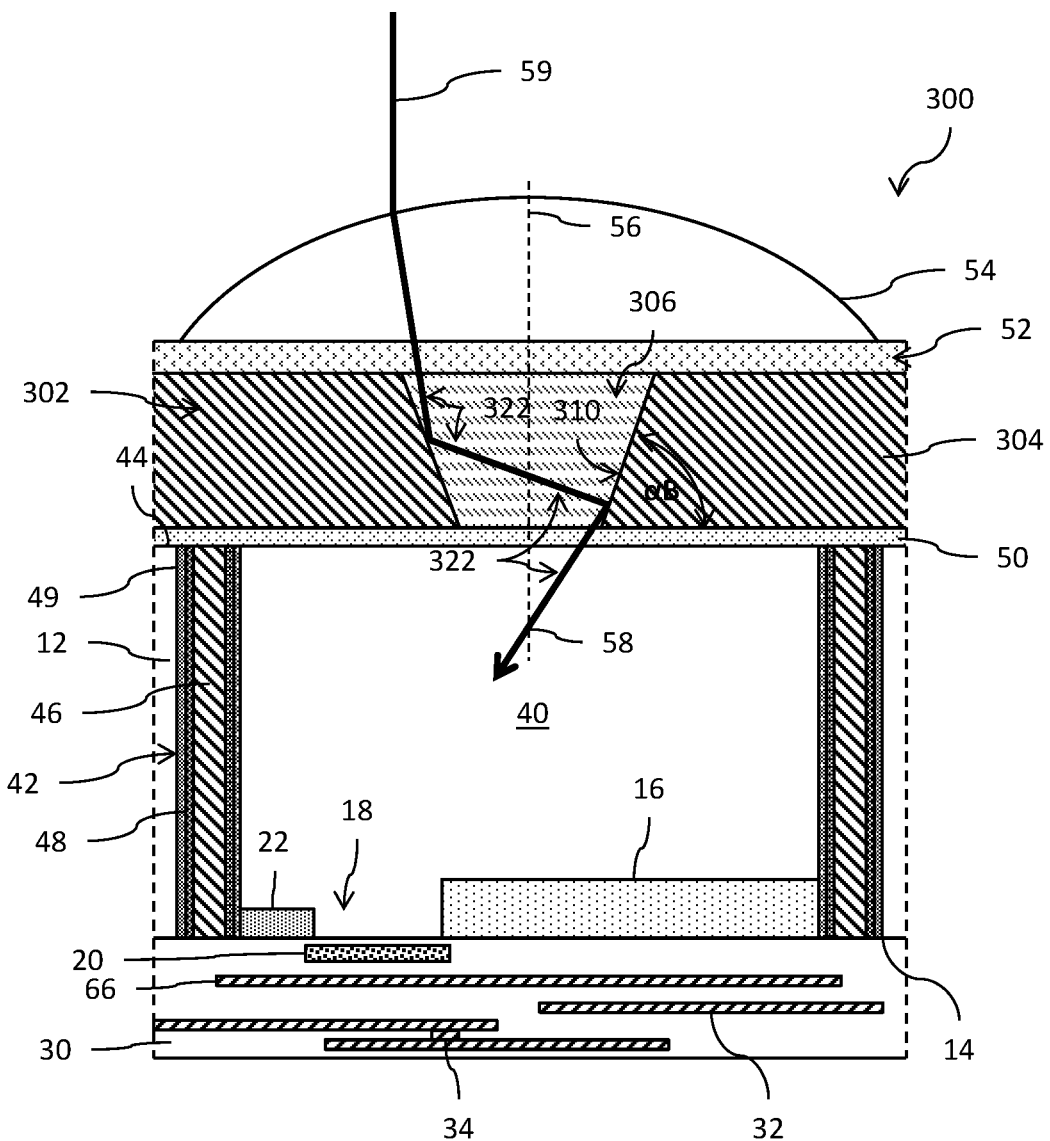

Depending on the angle of incidence of the ray or photon 59 collected by the microlens 54 and/or the angle α of the reflective surface 310 of the light guide 302 relative to a plane parallel to the back surface 44 of the semiconductor substrate 12, the ray or photon 59 collected by the microlens 54 may be reflected two or more times by the reflective surface 310, as generally shown at references 322 in FIG. 5B before passing through the pupil opening 314 and antireflection layer 50 to enter the pixel substrate region 40. The example of FIG. 5B shows that the angle αB of the reflective surface 310 is larger than the angle αA of the reflective surface 310 shown in FIG. 5A.

Other possible reflections of the ray or photon 322 are not shown in FIG. 5B, but it will be understood that reflections off one or more of the core region 46 of the isolation structure 42, the reflecting metal layer 66 and the underside reflective surface of the light guide 302 functioning as a backside light mirror, as shown in FIG. 5A, are possible to further improve sensitivity of the element 300.

Figure 5C:
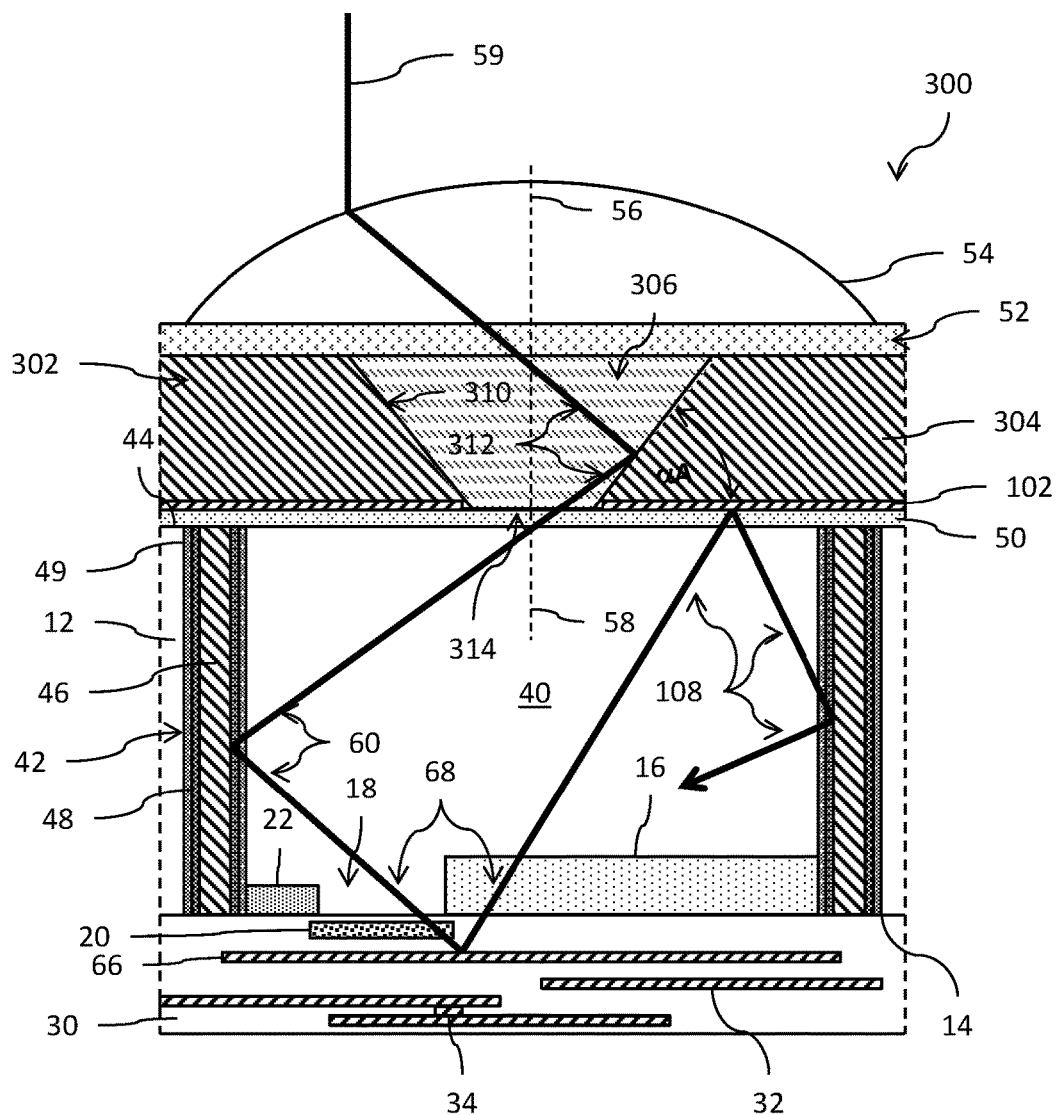
Figure 5D:
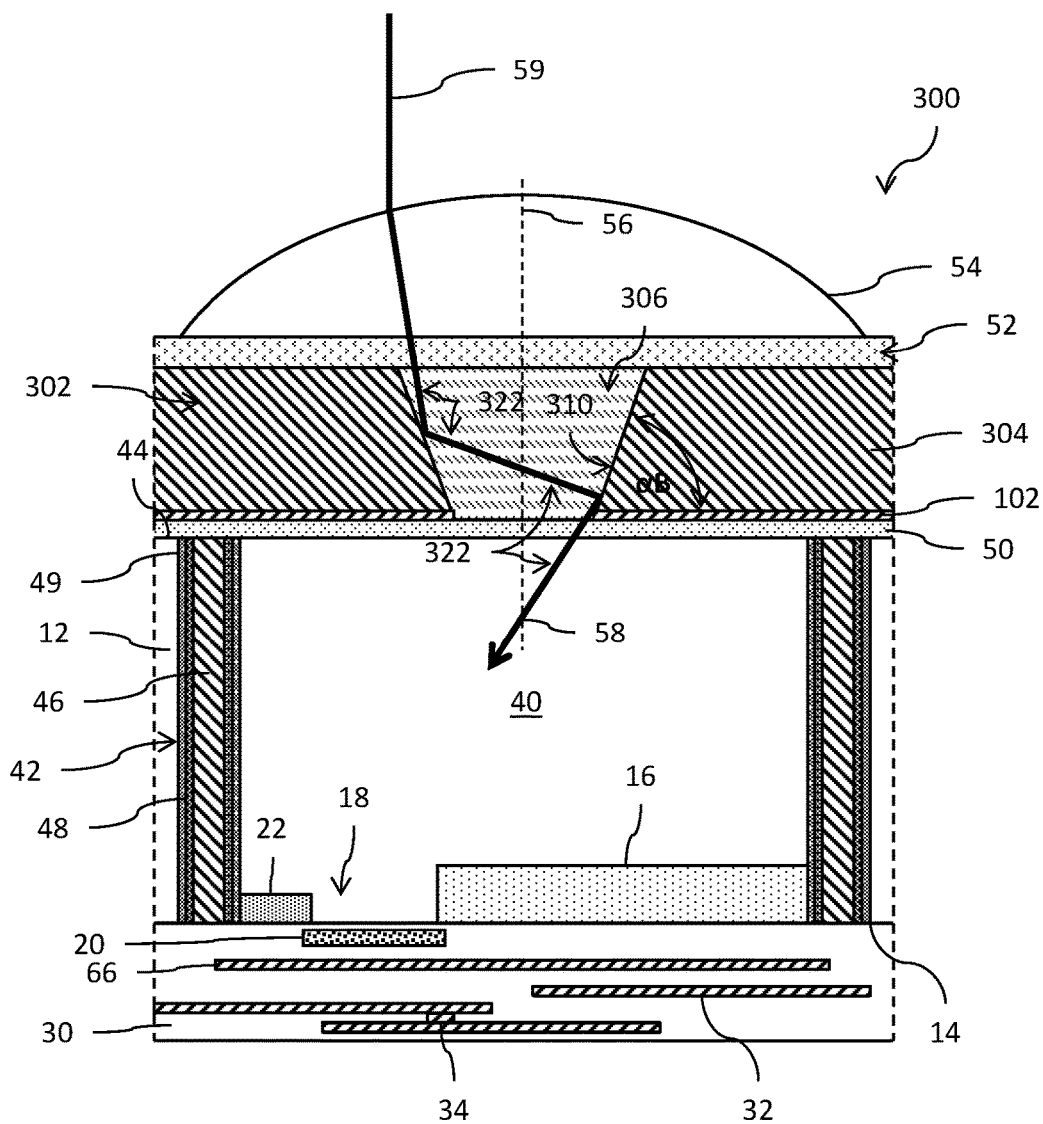

In an alternative embodiment as shown in FIGS. 5C-5D, the structure of the backside light mirror 102 is provided in addition to the structure of the backside light guide 302, with the backside light guide 302 mounted between the backside light mirror 102 and the color filter layer 52. In this implementation, the backside light mirror 102 and backside light guide 302 may be made of same or different reflective materials (preferably reflective metal materials). Furthermore, in this implementation reflections of rays or photons are made with respect to the underside reflective surface surface of the backside light mirror 102.

The configuration of the photosensitive structures and charge storage and transistor structures in FIGS. 1-5D is only one example of a pixel configuration. The backside light mirror and backside light guide as described above are equally useful in connection with pixels having configurations other than as illustrated in FIGS. 1-5D. For example, the pixel may instead have a configuration as taught by U.S. Pat. Nos. 8,436,440, 8,513,761 and 8,735,208, the disclosures of which are incorporated by reference.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A photosensor, comprising:
   a semiconductor substrate layer having a front side and a back side;
   an isolation structure delimiting an active region of the semiconductor substrate layer;
   a charge collecting region within the active region;
   a charge transfer circuit within the active region at the front side of the semiconductor substrate layer; and
   a reflecting mirror mounted at the back side of the semiconductor substrate layer, said reflecting mirror including a pupil opening configured to admit light into the active region at the back side and including an underside reflective surface configured to reflect light received from the active region back into the active region.

2. The photosensor of claim 1, further including an antireflective coating layer positioned between the back side of the semiconductor substrate layer and the reflecting mirror.

3. The photosensor of claim 1, wherein the reflecting mirror comprises a layer of reflective material.

4. The photosensor of claim 3, wherein the reflective material is a metal material.

5. The photosensor of claim 4, wherein the metal material is selected from the group consisting of: aluminum, titanium, titanium nitride, titanium alloy, tungsten, chromium, copper.

6. The photosensor of claim 1, wherein the reflecting mirror further comprises a light pipe aligned with the pupil opening and including a reflective conical surface configured to reflect light through the pupil opening.

7. The photosensor of claim 6, wherein the reflective conical surface is defined at an interface between a first transparent material having a first index of refraction and a second transparent material having a second index of refraction.

8. The photosensor of claim 6, wherein the reflective conical surface is defined by a frustoconical aperture formed in a layer of reflective material, said frustoconical aperture filled with a transparent material.

9. The photosensor of claim 8, wherein the reflective material is a metal material.

10. The photosensor of claim 9, wherein the metal material is selected from the group consisting of: aluminum, titanium, titanium nitride, titanium alloy, tungsten, chromium, copper.

11. The photosensor of claim 8, wherein the underside reflective surface of the reflecting mirror is formed from an additional layer of reflective material layer positioned between the layer of reflective material and the layer of reflective material having the frustoconical aperture.

12. The photosensor of claim 8, wherein said pupil opening is provided at a narrowest portion of the frustoconical aperture.

13. The photosensor of claim 8, further comprising a microlens mounted over the frustoconical aperture and configured to collect said light.

14. The photosensor of claim 6, further comprising a microlens mounted over the light pipe and configured to collect said light.

15. The photosensor of claim 1, further comprising a microlens mounted over the pupil opening and configured to collect said light.

16. A photosensor, comprising:
a semiconductor substrate layer having a front side and a back side;
an isolation structure delimiting an active region of the semiconductor substrate layer;
a charge collecting region within the active region;
a charge transfer circuit within the active region at the front side of the semiconductor substrate layer;
an antireflective coating layer mounted to the back side of the semiconductor substrate layer; and
a first layer made of a reflective metal material mounted to the antireflective coating layer, said first layer including a pupil opening configured to admit light into the active region at the back side, and wherein an underside reflective surface of said first layer is configured to reflect light received from the active region back into the active region.

17. The photosensor of claim 16, further comprising:
a second layer made of a reflective metal material mounted to the first layer, said second layer including a frustoconical aperture aligned with the pupil opening and filled with a transparent material, said frustoconical aperture defining a reflective conical surface configured to reflect light through the pupil opening.

18. The photosensor of claim 16, further comprising a microlens mounted over the pupil opening and configured to collect said light.

19. A photosensor, comprising:
a semiconductor substrate layer having a front side and a back side;
an isolation structure delimiting an active region of the semiconductor substrate layer;
a charge collecting region within the active region;
a charge transfer circuit within the active region at the front side of the semiconductor substrate layer;
an antireflective coating layer mounted to the back side of the semiconductor substrate layer; and
a layer made of a reflective metal material mounted to the antireflective coating layer, said layer including a frustoconical aperture filled with a transparent material, said frustoconical aperture defining a reflective conical surface configured to reflect light into the active region at the back side, and wherein an underside reflective surface of said layer is configured to reflect light received from the active region back into the active region.

20. The photosensor of claim 19, further comprising a microlens mounted over the frustoconical aperture and configured to collect said light.

* * * * *